United States Patent
Tan et al.

(10) Patent No.: US 11,189,666 B2
(45) Date of Patent: Nov. 30, 2021

(54) PIXEL ARRANGEMENT STRUCTURE, DISPLAY SUBSTRATE, AND DISPLAY DEVICE

(71) Applicant: BOE TECHNOLOGY GROUP CO., LTD., Beijing (CN)

(72) Inventors: Wenjing Tan, Beijing (CN); Lujiang Huangfu, Beijing (CN); Hongli Wang, Beijing (CN); Hui Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/618,540

(22) PCT Filed: Dec. 27, 2018

(86) PCT No.: PCT/CN2018/124446
§ 371 (c)(1),
(2) Date: Dec. 2, 2019

(87) PCT Pub. No.: WO2019/153942
PCT Pub. Date: Aug. 15, 2019

(65) Prior Publication Data
US 2020/0168674 A1  May 28, 2020

(30) Foreign Application Priority Data
Feb. 9, 2018 (CN) .......................... 201810135946.7

(51) Int. Cl.
*H01L 27/32* (2006.01)
*G09G 3/20* (2006.01)

(52) U.S. Cl.
CPC ....... *H01L 27/3218* (2013.01); *G09G 3/2003* (2013.01); *H01L 27/3216* (2013.01); *G09G 2300/0465* (2013.01)

(58) Field of Classification Search
CPC ............ H01L 27/3216; H01L 27/3218; G09G 3/2003; G09G 2300/0452; G09G 2300/0465; G02F 1/1333
See application file for complete search history.

(56) References Cited

U.S. PATENT DOCUMENTS

| 4,652,912 A | 5/1987 | Masubuchi |
| 8,354,789 B2 | 1/2013 | Kim et al. |

(Continued)

FOREIGN PATENT DOCUMENTS

| CN | 104362170 A | 2/2015 |
| CN | 104597655 A | 5/2015 |

(Continued)

*Primary Examiner* — Premal R Patel

(57) ABSTRACT

A pixel arrangement structure, a display substrate, and a display device. The pixel arrangement structure includes pixel groups extending in a first direction and arranged in a second direction, and each pixel group includes a first sub-pixel row, a second sub-pixel row, and a third sub-pixel row. The first sub-pixel row includes a plurality of first sub-pixels, the second sub-pixel row includes a plurality of second sub-pixel pairs, and the third sub-pixel row includes a plurality of third sup-pixels (310). The pitches of the plurality of first sub-pixels, the plurality of second sub-pixel pairs, and the plurality of third sub-pixels in the first direction are same. In each pixel group, a line connecting the centers of a first sub-pixel and a third sub-pixel adjacent to each other are substantially parallel to the second direction.

18 Claims, 6 Drawing Sheets

(56) References Cited

U.S. PATENT DOCUMENTS

| | | | |
|---|---|---|---|
| 8,754,913 B2 | 6/2014 | Hwang et al. | |
| 9,406,723 B2* | 8/2016 | Lee | H01L 27/3218 |
| 9,941,334 B2* | 4/2018 | Hsu | H01L 27/3216 |
| 10,170,027 B2* | 1/2019 | Lee | G09G 3/20 |
| 10,274,654 B2* | 4/2019 | Jin | G09F 9/3023 |
| 2002/0140713 A1* | 10/2002 | Klompenhouwer | G09G 3/32 |
| | | | 345/690 |
| 2003/0034992 A1* | 2/2003 | Brown Elliott | G09G 5/006 |
| | | | 345/690 |
| 2005/0088385 A1* | 4/2005 | Elliott | G06T 3/4007 |
| | | | 345/87 |
| 2011/0025723 A1* | 2/2011 | Kim | H01L 27/3218 |
| | | | 345/690 |
| 2013/0234917 A1 | 9/2013 | Lee | |
| 2016/0049438 A1* | 2/2016 | Murata | H01L 27/14623 |
| | | | 257/229 |
| 2016/0057817 A9* | 2/2016 | Ko | G09G 3/3208 |
| | | | 313/1 |
| 2016/0140929 A1* | 5/2016 | Chang | G09G 5/005 |
| | | | 345/522 |
| 2016/0155781 A1* | 6/2016 | Chaji | G09G 3/3607 |
| | | | 257/89 |
| 2016/0198544 A1* | 7/2016 | Chu | H05B 33/26 |
| | | | 313/505 |
| 2016/0357076 A1 | 12/2016 | Huangfu et al. | |
| 2016/0358985 A1 | 12/2016 | Bai et al. | |
| 2017/0308194 A1* | 10/2017 | Guard | G09G 5/02 |
| 2017/0317150 A1* | 11/2017 | Chung | H01L 27/3216 |
| 2018/0088260 A1 | 3/2018 | Jin et al. | |
| 2018/0227540 A1* | 8/2018 | Stolitzka | G09G 3/2003 |
| 2019/0326365 A1* | 10/2019 | Jin | H01L 27/3218 |

FOREIGN PATENT DOCUMENTS

| | | |
|---|---|---|
| CN | 205355055 A | 6/2016 |
| CN | 107621716 A | 1/2018 |

* cited by examiner

PIXEL ARRANGEMENT STRUCTURE, DISPLAY SUBSTRATE, AND DISPLAY DEVICE

The present application claims priority to Chinese patent application No. 201810135946.7, filed on Feb. 9, 2018, the entire disclosure of which is incorporated herein by reference as part of the present application.

TECHNICAL FIELD

Embodiments of the present disclosure relate to a pixel arrangement structure, a display substrate and a display device.

BACKGROUND

When display resolution of a display is equivalent to resolution of human eyes, the difference in the resolution of human eyes for different color sub-pixels can be utilized to change the conventional arrangement mode of red, green and blue sub-pixels. For example, a virtual pixel method of reducing the number of sub-pixels by sharing part of the sub-pixels, on the premise of forming an image of the same resolution, can reduce the density of physical sub-pixels, thereby reducing the process difficulty in the manufacturing process of the display device, improving the yield and reducing the cost.

SUMMARY

At least one embodiment of the present disclosure provides a pixel arrangement structure, a display substrate and a display device.

At least one embodiment of the present disclosure provides a pixel arrangement structure, comprising: a plurality of pixel groups extending in a first direction and arranged in a second direction, each of the plurality of pixel groups comprising one first sub-pixel row, one second sub-pixel row and one third sub-pixel row extending in the first direction and sequentially arranged in the second direction, the first sub-pixel row comprising a plurality of first sub-pixels, the second sub-pixel row comprising a plurality of second sub-pixel pairs, the third sub-pixel row comprising a plurality of third sub-pixels, a pitch of the plurality of first sub-pixels, a pitch the plurality of second sub-pixel pairs and a pitch the plurality of third sub-pixels in the first direction are identical to one another; wherein, in each of the plurality of pixel groups, a line through centers of a first sub-pixel and a third sub-pixel adjacent to each other are substantially parallel to the second direction, the first sub-pixel row is shifted from the second sub-pixel row by half of the pitch along the first direction, orthographic projections of a second sub-pixel pair and a first sub-pixel adjacent to each other, on a straight line extending in the first direction, overlap with each other, and the first sub-pixel rows of two adjacent pixel groups are shifted from each other by half of the pitch along the first direction.

In some examples, the second sub-pixel pairs are green sub-pixel pairs, the first sub-pixels are red sub-pixels and the third sub-pixels are blue sub-pixels; or, the first sub-pixels are blue sub-pixels and the third sub-pixels are red sub-pixels.

In some examples, the first sub-pixels, the second sub-pixel pairs and the third sub-pixels are all of a square or rounded square shape, diagonal lines of the square or rounded square shape are substantially parallel to the first direction or the second direction, and the first direction is substantially perpendicular to the second direction.

In some examples, in the first direction, a minimum distance between two adjacent second sub-pixel pairs is less than at least one of a size of each of the first sub-pixels and a size of each of the third sub-pixels.

In some examples, the first sub-pixels, the second sub-pixel pairs and the third sub-pixels have a substantial identical side length.

In some examples, two second sub-pixels in each of the second sub-pixel pairs are of substantial identical shape and size.

In some examples, a minimum distance between the two second sub-pixels in each of the second sub-pixel pairs is less than a minimum distance between the second sub-pixel pairs and the first sub-pixels or between the second sub-pixel pairs and the third sub-pixels.

In some examples, the two second sub-pixels in each of the second sub-pixel pairs have a shape of rectangle or rounded rectangle.

In some examples, the two second sub-pixels in each of the second sub-pixel pairs have a shape of right triangle or rounded right triangle.

In some examples, in each of the plurality of pixel groups, centers of two adjacent first sub-pixels and centers of two third sub-pixels respectively adjacent to the two adjacent first sub-pixels in the second direction are four vertices of a virtual rectangle, a center of one second sub-pixel pair surrounded by the four sub-pixels is located at a center of the virtual rectangle, and a distance along the first direction between centers of two adjacent virtual rectangles in two adjacent pixel groups respectively, is half of a side length of the virtual rectangle.

In some examples, two second sub-pixels in each of the second sub-pixel pairs are a first pixel block and a second pixel block, respectively, the pixel arrangement structure comprises a plurality of minimum repeating units, each of the plurality of minimum repeating units comprises one first sub-pixel, one first pixel block, one second pixel block and one third sub-pixel, one of the first pixel block and the second pixel block forms a first virtual pixel together with the first sub-pixel, and the other of the first pixel block and the second pixel block forms a second virtual pixel together with the third sub-pixel.

In some examples, each of the plurality of minimum repeating units comprises one first sub-pixel, one second sub-pixel pair, and one third sub-pixel, and in each of the plurality of minimum repeating units, the first sub-pixel and the third sub-pixel are adjacent to each other along an extending direction of a first diagonal line of the virtual rectangle; the second sub-pixel pair and the first sub-pixel are adjacent to each other along an extending direction of a second diagonal line of the virtual rectangle; the second sub-pixel pair and the third sub-pixel are adjacent to each other along the second direction, and the extending direction of the first diagonal line and the extending direction of the second diagonal line are intersected with each other.

In some examples, the first sub-pixel and the third sub-pixel in each of the plurality of minimum repeating units are adjacent to each other along the second direction.

In some examples, in each of the plurality of minimum repeating units, the first pixel block is one pixel block adjacent to the third sub-pixel among the first and second pixel blocks in the second sub-pixel pair adjacent to the third sub-pixel along the second direction, and the second pixel block is one pixel block remote from the first sub-pixel among the first and second pixel blocks in the second sub-pixel pair adjacent to both the first sub-pixel and the third sub-pixel along an extending direction of a diagonal line of the virtual rectangle.

In some examples, in each of the plurality of minimum repeating units, the first pixel block is one pixel block adjacent to the first sub-pixel among the first and second pixel blocks in the second sub-pixel pair adjacent to both the first sub-pixel and the third sub-pixel along an extending direction of a diagonal line of the virtual rectangle, and the second pixel block is one pixel block remote from the third sub-pixel among the first and second pixel blocks in the second sub-pixel pair adjacent to the third sub-pixel along the second direction.

In some examples, in each of the plurality of minimum repeating units, the first pixel block is one pixel block remote from the third sub-pixel among the first and second pixel blocks in the second sub-pixel pair adjacent to the third sub-pixel along the second direction, and the second pixel block is one pixel block remote from the third sub-pixel among the first and second pixel blocks in the second sub-pixel pair adjacent to both the first sub-pixel and the third sub-pixel along an extending direction of a diagonal line of the virtual rectangle.

In some examples, in each of the plurality of minimum repeating units, the first pixel block is one pixel block adjacent to the third sub-pixel among the first and second pixel blocks in the second sub-pixel pair adjacent to both the first sub-pixel and the third sub-pixel along an extending direction of a diagonal line of the virtual rectangle, and the second pixel block is one pixel block adjacent to the third sub-pixel among the first and second pixel blocks in the second sub-pixel pair adjacent to the third sub-pixel along the second direction.

In some examples, in each of the plurality of minimum repeating units, shapes of the first pixel block and the second pixel block are right triangles or rounded right triangles; one of the first pixel block and the second pixel block is located in the second sub-pixel pair adjacent to both the first sub-pixel and the third sub-pixel along an extending direction of a diagonal line of the virtual rectangle; the other of the first pixel block and the second pixel block is located in the second sub-pixel pair adjacent to the third sub-pixel along the second direction; and along the first direction or the second direction, an orientation of a right angle or rounded right angle of the first pixel block is opposite to an orientation of a right angle or rounded right angle of the second pixel block.

In some examples, along the first direction, a minimum distance between two adjacent first sub-pixels is substantially equal to a minimum distance between two adjacent third sub-pixels.

At least one embodiment of the present disclosure provides a display substrate, including: the pixel arrangement structure according to the above embodiments.

At least one embodiment of the present disclosure provides a display device, including the display substrate according to the above embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
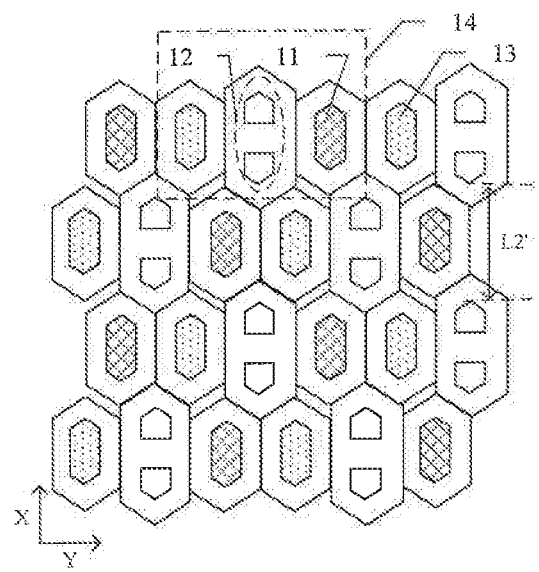
FIG. 1 is a schematic diagram of a GGRB pixel arrangement structure.

FIG. 1 is a schematic diagram of a GGRB pixel arrangement structure, that is, a schematic diagram of a pixel arrangement structure in which green, green, red, and blue sub-pixels are arranged in cycles. As shown in FIG. 1, the pixel arrangement structure include a red sub-pixel 11, a blue sub-pixel 13, and a green sub-pixel pair 12, and the green sub-pixel pair 12 includes two green sub-pixels. The red sub-pixel 11 and the blue sub-pixel 13 are both hexagonal in shape, the opposite sides of each of three pairs of opposite sides of the hexagon are parallel to each other, each green sub-pixel in the green sub-pixel pair 12 is pentagonal in shape, the pentagon includes a pair of parallel opposite sides and a vertical side, the vertical side is perpendicular to the pair of parallel opposite sides, and the vertical sides in the two green sub-pixels of the green sub-pixel pair 12 are arranged adjacent to each other.

In a Y direction, a red sub-pixel 11 and a blue sub-pixel 13 are disposed between two adjacent green sub-pixel pairs 12. Taking that four sub-pixels enclosed by the dashed frame in the figure form two virtual pixels as an example, the red sub-pixel 11 and one green sub-pixel in the green sub-pixel pair 12 form one virtual pixel, the blue sub-pixel 13 and the other green sub-pixel in the green sub-pixel pair 12 form another virtual pixel, and the red sub-pixel 11 and the blue sub-pixel 13 are respectively shared by the two virtual pixels.

In research, the inventors of the present application have observed: a distance L2' between two adjacent green sub-pixel pairs 12 arranged in an X direction shown in FIG. 1 is greater than a maximum size of the red sub-pixel 11 (or the blue sub-pixel 13) in the X direction, therefore, when a display device including the pixel arrangement structure shown in FIG. 1 is displaying, the green sub-pixel pairs will generate a distinct graininess.

The embodiments of the present disclosure provide a pixel arrangement structure, a display substrate and a display device. The pixel arrangement structure includes: a plurality of pixel groups extending in a first direction and arranged in a second direction, each of the plurality of pixel groups including one first sub-pixel row, one second sub-pixel row and one third sub-pixel row extending in the first direction and sequentially arranged in the second direction, the first sub-pixel row including a plurality of first sub-pixels, the second sub-pixel row including a plurality of second sub-pixel pairs, the third sub-pixel row including a plurality of third sub-pixels, the first direction being perpendicular to the second direction, a pitch of the plurality of first sub-pixels, a pitch of the plurality of second sub-pixel pairs and a pitch of the plurality of third sub-pixels in the first direction are the same. In each of the plurality of pixel groups, a line through centers of a first sub-pixel and a third sub-pixel adjacent to each other are substantially parallel to the second direction, the first sub-pixel row are shifted from the second sub-pixel row by half of the pitch along the first direction, orthographic projections of a second sub-pixel pair and a first sub-pixel adjacent to each other, on a straight line extending in the first direction, overlap with each other, and the first sub-pixel rows of two adjacent pixel groups are shifted from each other by half of the pitch along the first direction. The pixel arrangement structure can reduce the distance between two adjacent second sub-pixel pairs arranged along the first direction, thereby reducing graininess generated by the second sub-pixel pairs during display.

The pixel arrangement structure, the display substrate and the display device provided by the embodiments of the present disclosure will be described below with reference to the accompanying drawings.

Figure 2A:
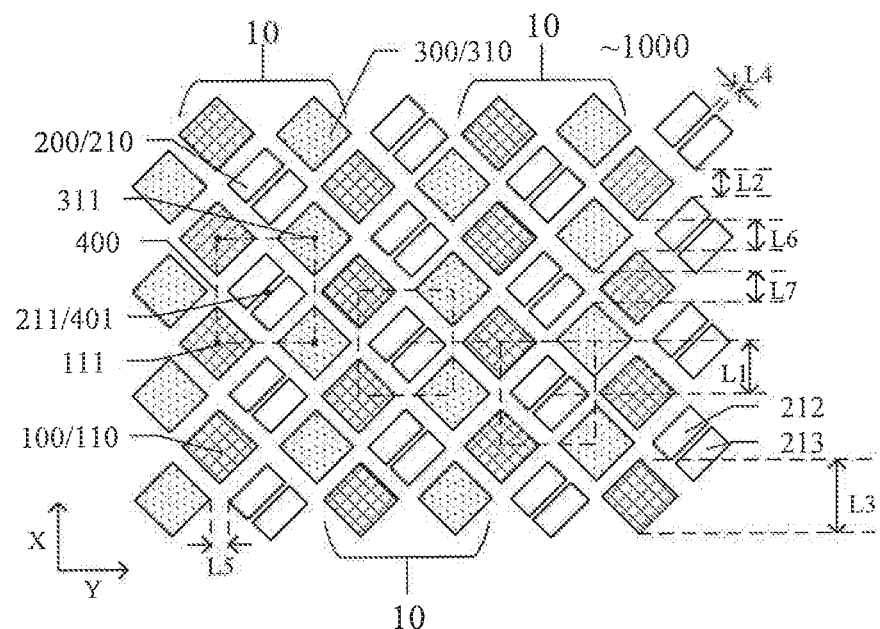
FIG. 2A is a schematic diagram of a pixel arrangement structure provided by an embodiment of the present disclosure.

FIG. 2A is a schematic diagram of a pixel arrangement structure provided by an embodiment of the present disclosure. As shown in FIG. 2A, the pixel arrangement structure includes a plurality of pixel groups 10 extending in a first direction (i.e., an X direction) and arranged in a second direction (i.e., a Y direction), each pixel group 10 includes one first sub-pixel row 100, one second sub-pixel row 200, and one third sub-pixel row 300 extending in the first direction and sequentially arranged in the second direction. The first sub-pixel row 100 includes a plurality of first sub-pixels 110, the second sub-pixel row 200 includes a plurality of second sub-pixel pairs 210, the third sub-pixel row 300 includes a plurality of third sub-pixels 310, and the first direction is perpendicular to the second direction. Here, the second sub-pixel pair 210 refers to a second sub-pixel pair 210 composed of two second sub-pixels. A pitch of the plurality of first sub-pixels 110, a pitch the plurality of second sub-pixel pairs 210 and a pitch of the plurality of third sub-pixels 310 in the first direction are the same. The pixel row here may refer to a horizontally arranged series of pixels or a vertically arranged series (column) of pixels, and the present embodiment will be described by taking that the pixel row is a vertically arranged series of pixels as an example.

As shown in FIG. 2A, in each pixel group 10, a line through centers of a first sub-pixel 110 and a third sub-pixel 130 adjacent to each other (a line through the center 111 of the first sub-pixel 110 and the center 311 of the third sub-pixel 310) is substantially parallel to the second direction (the Y direction). The first sub-pixel row 100 are shifted from the second sub-pixel row 200 by half of the pitch along the first direction (the X direction), orthogonal projections of a second sub-pixel pair 210 and a first sub-pixel 110 adjacent to each other, on a straight line extending in the first direction, overlap with each other, and the first sub-pixel rows 100 of two adjacent pixel groups 10 are shifted from each other by half of the pitch along the first direction, for example, L1.

As shown in FIG. 2A, in each pixel group 10, centers 111 of two adjacent first sub-pixels 110 and centers 311 of two third sub-pixels 310 respectively adjacent to the two adjacent first sub-pixels 110 in the second direction are four vertices of a virtual rectangle 400. That is, in each pixel group 10, the virtual rectangle 400 can be obtained by connecting the centers 111 of the two adjacent first sub-pixels 110 and the centers 311 of the two third sub-pixels 310 respectively adjacent to the two adjacent first sub-pixels 110 in the second direction. A center 211 of one second sub-pixel pair 210 surrounded by the above four sub-pixels is located at a center 401 of the virtual rectangle 400, that is, the center 211 of the second sub-pixel pair 210 coincides with the center 401 of the virtual rectangle 400. And, along the first direction, a distance L1 between centers 401 of two adjacent virtual rectangles 400 located in two adjacent pixel groups 10 respectively, is half of a side length of the virtual rectangle 400, that is, along the first direction, the two adjacent pixel groups 10 are relatively shifted from each other by half of the side length of the virtual rectangle 400.

It should be noted that, upon designing a pixel arrangement structure, the sub-pixel is generally designed in a regular shape, such as a hexagon, a pentagon, a trapezoid or other shapes. The center of a sub-pixel may be the geometric center of the above regular shape upon designing. However, in an actual manufacturing process, the shape of the formed sub-pixels generally deviates from the regular shape of the above design. For example, corners of the abovementioned regular shape may be rounded; therefore, the shape of the sub-pixel can be a pattern with rounded angle. Furthermore, the shape of the actually fabricated sub-pixel can also have other variations from the shape of the design. For example, the shape of a sub-pixel designed as a hexagon may become approximately elliptical in actual fabrication. Therefore, the center of the sub-pixel may also not be the strict geometric center of the irregular shape of the formed sub-pixel. In embodiments of the present disclosure, the center of the sub-pixel may have a certain offset from the geometric center of the shape of the sub-pixel. The center of a sub-pixel refers to any point in a region surrounded by specific points on radiation segments each of which is from a geometric center of the sub-pixel to a point on the edge of the sub-pixel, each of the specific points is located on a corresponding radiation segment at location ⅓ of length of the radiant section from the geometric center. The definition of the center of the sub-pixel is applicable to the center of the sub-pixel having the regular shape, and is also applicable to the center of the sub-pixel having the irregular shape. As described above, a shape of an actual fabricated sub-pixel may deviate from the designed sub-pixel shape because of various manufacturing errors. Therefore, in the present disclosure, there may be a certain error about a position of the center of the sub-pixel and a relationship between the positions of the sub-pixel center and other objects. For example, assuming that a line connecting the centers of the sub-pixels or a line passing through the centers of the sub-pixels satisfies other corresponding definitions (for example, the extending direction), it is allowed that the lines pass through the region enclosed by the above-mentioned specific points of the radiation segments. For example, a center of a sub-pixel is located on a certain line, which means that the line can pass through the region enclosed by the above-mentioned specific points of the radiation segments.

For example, as shown in FIG. 2A, in the pixel arrangement structure provided by the present embodiment, any one column of sub-pixels arranged in the first direction are sub-pixels having a same color; a first sub-pixel 110 and a third sub-pixel 310 are sequentially arranged in the second direction between two adjacent second sub-pixel pairs 210. For example, in the second direction, the first sub-pixel 110, the third sub-pixel 310 and the second sub-pixel pair 210 are arranged in cycles; a first sub-pixel 110 and a third sub-pixel 310 are sequentially arranged between two adjacent second sub-pixel pairs 210 along a diagonal direction of the virtual rectangle 400, for example, the first sub-pixel 110, the second sub-pixel pair 210 and the third sub-pixel 310 are arranged in cycles along the diagonal direction of the virtual rectangle 400.

For example, as shown in FIG. 2A, in each pixel group 10, along the second direction, the line through the centers of the first sub-pixel 110 and the third sub-pixel 310 adjacent to each other is parallel to the second direction, while a line through the centers 111 of two adjacent first sub-pixels 110 and a line through the centers 311 of two adjacent third sub-pixels 310 are parallel to the first direction.

For example, as shown in FIG. 2A, in each pixel group 10, along the second direction, a length of the line through the centers of the first sub-pixel 110 and the third sub-pixel 310 adjacent to each other is L0 (not shown in the figure), a length of the line through the centers 111 of the two adjacent first sub-pixels 110 and a length of the line through the centers 311 of the two adjacent third sub-pixels 310 are both L0, and the shape of the virtual rectangle 400 is a square.

For example, as shown in FIG. 2A, the second sub-pixel pair 210 is a green sub-pixel pair. The first sub-pixel 110 is a red sub-pixel and the third sub-pixel 310 is a blue sub-pixel; or, the first sub-pixel 110 is a blue sub-pixel and the third sub-pixel 310 is a red sub-pixel. The present embodiment is described by taking that the first sub-pixel 110 is a red sub-pixel and the third sub-pixel 310 is a blue sub-pixel as an example. According to the physiological structure of a human eye, the density of different cone-shaped photoreceptor cells sensitive to different colors on the retina of the human eye is lower than that of rod-shaped cells, the density of blue-sensitive cone-shaped photoreceptor cells sensitive to short wavelengths is the lowest, followed by red-sensitive cone-shaped photoreceptor cells, and the luminance effect of red and blue (stimulation on rod-shaped cells sensitive to luminance) is much lower than that of green, therefore, the resolution of the human eye to the positions of a blue sub-pixel and a red sub-pixel is significantly lower than the resolution to the position of a green sub-pixel and the resolution to the position of the luminance center of a pixel. At a certain pixel resolution, although the human eye can distinguish the position of the luminance center of the pixel and have a normal sense of color, the human eye may not distinguish the position or boundary of the blue sub-pixel or the red sub-pixel on the pixel scale. Therefore, the color of the second sub-pixel pair 210 in the present embodiment is green.

For example, the two second sub-pixels in the second sub-pixel pair 210 in the present embodiment are manufactured by using an opening in a fine metal mask (FMM) plate, which can effectively reduce the process difficulty of FMM.

For example, in the fine metal mask process, an opening of the fine metal mask is used for evaporating a second sub-pixel pair. Before evaporating light emitting layers of the second sub-pixel pair, electrodes of the two second sub-pixels in the second sub-pixel pair are firstly manufactured, and in the XY plane, the electrodes of the two second sub-pixels are separated by an insulating material. Therefore, when evaporating a light emitting material at the position of the second sub-pixel pair, the light emitting material evaporated onto the electrodes respectively forms the light emitting layers of the two second sub-pixels for emitting light, while the light emitting material evaporated onto the insulating material cannot emit light, and the insulating material between the electrodes of the two second sub-pixels is formed as a spacing between the two second sub-pixels. Therefore, the shape of the light emitting region of the second sub-pixel pair 210 is determined by the shape of the electrodes.

Figure 2B:
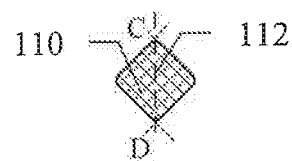
FIG. 2B is a schematic diagram of a sub-pixel in FIG. 2A having a rounded square shape.
Figure 2C:
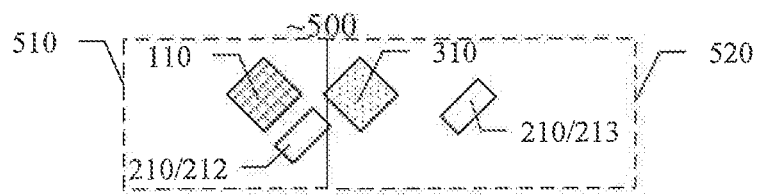
FIG. 2C is a schematic diagram of a minimum repeating unit in the pixel arrangement structure shown in FIG. 2A.
Figure 2D:
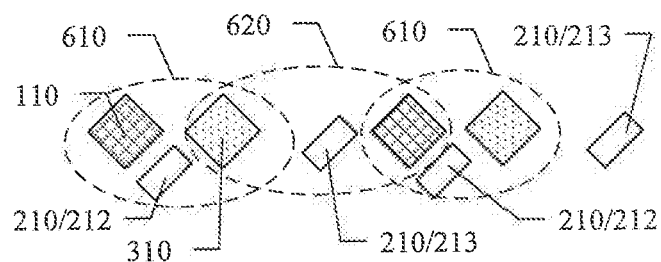
FIG. 2D is a schematic diagram of a pixel arrangement structure including two minimum repeating units shown in FIG. 2C.
Figure 2E:
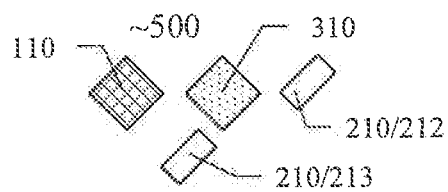
FIG. 2E is a schematic diagram of another minimum repeating unit in the pixel arrangement structure shown in FIG. 2A.
Figure 2F:
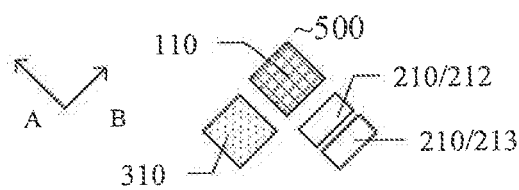
FIG. 2F is a schematic diagram of further another minimum repeating unit in the pixel arrangement structure shown in FIG. 2A.
Figure 2G:
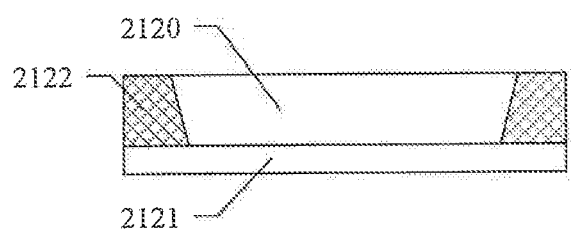
FIG. 2G is a partial cross-sectional view of a second sub-pixel in a second sub-pixel pair.

For example, FIG. 2G is a partial cross-sectional view of a second sub-pixel in a second sub-pixel pair. The electrode (e.g., anode) and the light emitting layer of each sub-pixel are in contact with each other, so that the light emitting layer can be driven to emit light at the portion in contact with each other, and therefore, the portion where the electrode and the light emitting layer are in contact with each other is an effective portion of the sub-pixel capable of emitting light.

Here, taking the second sub-pixel 212 as an example, the anode 2121 and the light emitting layer 2120 of the second sub-pixel 212 are in contact with each other, and the portion where the anode 2121 and the light emitting layer 2120 are in contact with each other is an effective portion of the second sub-pixel 212 capable of emitting light.

Here, the electrode is used as a pixel electrode, so that different data voltages can be applied to different sub pixels. However, according to the embodiments of the present disclosure, the electrode used as the pixel electrode of the sub-pixel is not limited to the anode, and a cathode of a light emitting diode can also be used as the pixel electrode. Therefore, in the embodiments of the present disclosure, the shape of a sub-pixel may refer to the shape of the portion where the pixel electrode and the light emitting layer are in contact with each other. For example, for each sub-pixel, the area of the pixel electrode may be slightly larger than the area of the light emitting layer, or the area of the light emitting layer may be slightly larger than the area of the pixel electrode, which is not particularly limited in the embodiments of the present disclosure. For example, the light emitting layer here may include an electroluminescent layer itself and other functional layers on both sides of the electroluminescent layer, such as a hole injecting layer, a hole transporting layer, an electron injecting layer and an electron transporting layer, etc.

In some embodiments, the shape of the sub-pixel may also be defined by a pixel defining layer. For example, as shown in FIG. 2G, an electrode of a light emitting diode (e.g., the anode 2121 of the second sub-pixel 212) can be disposed below a pixel defining layer 2122, the pixel defining layer 2122 includes an opening for defining a sub-pixel, the opening exposes a portion of the anode 2121. When the light emitting layer 2120 is formed in the opening of the pixel defining layer 2122 described above, the light emitting layer 2122 is in contact with the anode 2121, so that the portion of the anode 2121 can drive the light emitting layer 2120 to emit light. Therefore, in this case, the opening of the pixel defining layer defines the shape of the sub-pixel.

For example, the various shapes of sub-pixels described in the embodiments of the present disclosure are all approximate shapes. When forming the light emitting layer or various electrode layers, it is not guaranteed that the edges of the sub-pixels are strictly straight lines and the corners are strictly angular. For example, the light emitting layer can be formed by an evaporation process using a mask, and therefore, corners thereof may be rounded. In some cases, metal etching may provide a draft angle, and therefore, when forming a light emitting layer of a sub-pixel by an evaporation process, one corner of the light emitting layer may be removed.

For example, FIG. 2B is a schematic diagram of a sub-pixel shown in FIG. 2A having a rounded square shape. The "rounded" here refer to that the corners of the sub-pixel are rounded. For example, in a case where the light emitting layer is evaporated by using a mask, the part of the light emitting layer located at the corners may naturally form a rounded shape.

As shown in FIG. 2A and FIG. 2B, shapes of the first sub-pixel 110, the second sub-pixel pair 210 and the third sub-pixel 310 are all square or rounded square, and diagonal lines of the square or rounded square are parallel to the first direction or the second direction. Here, the shapes of the first sub-pixel 110 and the third sub-pixel 310 are the shapes of the light emitting regions thereof. The shape of the second sub-pixel pair 210 is the overall shape of the light emitting regions of the two second sub-pixels and the spacing between the two light emitting regions, that is, the shape of the second sub-pixel pair 210 being square means that the overall shape of the light emitting regions of the two second sub-pixels and the spacing between the light emitting regions of the two second sub-pixels is square. The square mentioned above may be a standard square or may include an approximate square other than a rounded square. The approximate square may include a square with an angle of approximately 90 degrees between adjacent sides, or a square with four sides almost equal in length, etc., and the present embodiment is not limited to these cases.

For example, as shown in FIG. 2A and FIG. 2B, a rounded square refers to a case in which at least one of four corners of a square is rounded, that is, the adjacent sides of the square are connected by a short arc to form a rounded corner. In FIG. 2B, the shape of the first sub-pixel 110 is a rounded square (and all four corners thereof are rounded corners), and the four sides of the rounded square can intersect with each other to form a square after being extended, wherein a portion, located in the rounded square, of a line connecting the opposite two points C and D among the intersection points of the four sides after being extended, is a diagonal line 112 of the rounded square, and the diagonal line 112 is parallel to the first direction, that is, the X direction.

For example, the shapes of the openings of the fine metal mask used for manufacturing the pixel arrangement structure are all designed to be square or rounded square. By minimizing the spacing of the openings of the fine metal mask, the pixel arrangement structure manufactured as shown in FIG. 2A can effectively utilize the space of the active area, ensure the display effect of the second sub-pixel (green sub-pixel), and reduce the graininess, caused by manufacturing two second sub-pixels by one opening of the mask, of the second sub-pixel during display.

For example, as shown in FIG. 2A, a side length of the first sub-pixel 110 (a side length of a square or rounded square), a side length of the second sub-pixel pair 210 (a side length of a square or rounded square) and a side length of the third sub-pixel 310 (a side length of a square or rounded square) are substantially the same, that is, the shapes and sizes of the first sub-pixel 110, the second sub-pixel pair 210, and the third sub-pixel 310 in the present embodiment are all the same (all of them are square or rounded square), therefore, the shapes and sizes of the respective openings of the fine metal mask used to manufacture the above pixel arrangement structure are the same. Due to manufacturing process and other reasons, the side length of the first sub-pixel 110 (the side length of a square or rounded square), the side length of the second sub-pixel pair 210 (the side length of a square or rounded square) and the side length of the third sub-pixel 310 (the side length of a square or rounded square) may not be exactly the same, but are approximately the same.

For example, as shown in FIG. 2A, in the first direction, a distance L2 between two adjacent second sub-pixel pairs 210 is less than a size of at least one of the first sub-pixel 110 and the third sub-pixel 310 (e.g., the size of the first sub-pixel 110 in the first direction is L3). Therefore, compared with the pixel arrangement structure shown in FIG. 1, in the pixel arrangement structure provided by the present embodiment, the distance between two adjacent second sub-pixel pairs in the first direction is reduced, and therefore, a display device including the pixel arrangement structure provided by the present embodiment can effectively reduce the graininess generated by the green sub-pixels during display.

For example, as shown in FIG. 2A, in the first direction, a distance L6 between two adjacent first sub-pixels 110 is equal to a distance L7 between two adjacent third sub-pixels 310.

For example, as shown in FIG. 2A, in the first direction, the distance L2 between two adjacent second sub-pixel pairs 210 is equal to the distance L7 between two adjacent third sub-pixels 310.

For example, as shown in FIG. 2A, in each pixel group 10, a distance between a first sub-pixel 110 and a third sub-pixel 310 arranged in the second direction and adjacent to each other is equal to the distance between two adjacent first sub-pixels 110 arranged in the first direction, that is, along the second direction, the length of the line through the centers of the first sub-pixel 110 and the third sub-pixel 310 adjacent to each other is equal to the length of the line through the centers 111 of the two adjacent first sub-pixels 110, and in this case, the shape of the virtual rectangle 400 is square.

For example, the center lines, extending in the first direction, of two adjacent pixel groups 10 arranged in the second direction, are parallel to each other, and a plurality of center lines, extending in the first direction, of different pixel groups 10, are arranged at equal intervals.

For example, as shown in FIG. 2A, the shapes and sizes of the two second sub-pixels 212 and 213 in the second sub-pixel pair 210 are all the same, that is, the second sub-pixel pair 210 is composed of two identical second sub-pixels 212 and 213.

For example, as shown in FIG. 2A, the shapes of the two second sub-pixels 212 and 213 in the second sub-pixel pair 210 are both rectangular. For example, as shown in FIG. 2A, an angle between an extending direction of a long side of the rectangle and a direction indicated by the arrow in the Y direction is an acute angle, for example, 45 degrees.

For example, as shown in FIG. 2A, a length of the long side of the rectangle is the same as the side length of the first sub-pixel 110. Because there exists a spacing between the two second sub-pixels 212 and 213 having a rectangular shape in the second sub-pixel pair 210, the sum of the lengths of the short sides of the two rectangles is slightly less than the length of the long side of the rectangle. The present embodiment is not limited to this case, the sum of the lengths of the short sides of the two rectangles may be equal to the length of the long side of the rectangle, and in this case, the shape of the second sub-pixel pair 210 may be approximately square.

For example, as shown in FIG. 2A, a minimum distance L4 between the two second sub-pixels 212 and 213 in the second sub-pixel pair 210 is less than a minimum distance L5 between the second sub-pixel pair 210 and the third sub-pixel 310 (or the first sub-pixel 110). In FIG. 2A, the minimum distance L5 between the second sub-pixel pair 210 and the third sub-pixel 310 is a minimum distance between the second sub-pixel pair 210 and the third sub-pixel 310 in the second direction, but is not limited thereto. For example, the minimum distance L5 between the second sub-pixel pair 210 and the third sub-pixel 310 may also be a minimum distance between the second sub-pixel pair 210 and the third sub-pixel 310 in a direction parallel to the side of the square.

In the present embodiment, a suitable distance is set between the two second sub-pixels 212 and 213 in the second sub-pixel pair 210, which reduces the process difficulty and simultaneously ensures the smoothness and continuity of horizontal and vertical lines of luminance centers to the greatest extent under the condition of high resolution.

For example, FIG. 2C is a schematic diagram of a minimum repeating unit in the pixel arrangement structure shown in FIG. 2A. As shown in FIG. 2A and FIG. 2C, the two second sub-pixels 212 and 213 in each second sub-pixel pair 210 are a first pixel block 212 and a second pixel block 213, respectively, that is, a plurality of second sub-pixel pairs 210 include a plurality of first pixel blocks 212 and a plurality of second pixel blocks 213.

For example, as shown in FIG. 2A and FIG. 2C, the pixel arrangement structure includes a plurality of minimum repeating units 500, each of which includes a first sub-pixel 110, a first pixel block 212, a second pixel block 213 and a third sub-pixel 310. One of the first pixel block 212 and the second pixel block 213 forms a first virtual pixel 510 together with the first sub-pixel 110, the other of the first pixel block 212 and the second pixel block 213 forms a second virtual pixel 520 together with the third sub-pixel 310, and a first sub-pixel 110 and a third sub-pixel 310 are shared by the first virtual pixel 510 and the second virtual pixel 520, respectively. The virtual pixel described in the present embodiment is not a real pixel in a strict definition, where a pixel is defined by one blue sub-pixel, one green sub-pixel and one red sub-pixel as a whole. Here, the minimum repeating unit means that the pixel arrangement structure can be formed by repeatedly arranging the minimum repeating units.

It should be noted that the first pixel block 212 and the second pixel block 213 in each minimum repeating unit 500 may be two second sub-pixels in a same second sub-pixel pair 210, or may be second sub-pixels in different second sub-pixel pairs 210, respectively.

For example, as shown in FIG. 2A and FIG. 2C, in each minimum repeating unit 500, the first sub-pixel 110 and the third sub-pixel 310 are adjacent to each other in the second direction; the first pixel block 212 is one block adjacent to the first sub-pixel 110 among the first and second pixel blocks in the second sub-pixel pair 210 adjacent to both the first sub-pixel 110 and the third sub-pixel 310 along an extending direction of a diagonal line of the virtual rectangle 400; and the second pixel block 213 is one block remote from the third sub-pixel 310 among the first and second pixel blocks in the second sub-pixel pair 210 adjacent to the third sub-pixel 310 along the second direction. Here, the first pixel block 212 and the second sub-pixel block 213 are respectively located in two second sub-pixel pairs 210, and the shapes of the first pixel block 212 and the second pixel block 213 in the minimum repetition unit 500 may form a square.

For example, FIG. 2D is a schematic diagram of a pixel arrangement structure including two minimum repeating units shown in FIG. 2C. As shown in FIG. 2C and FIG. 2D, different from the sub-pixel sharing method shown in FIG. 2C, a first minimum repeating unit of the present example includes a first pixel 610 and a second pixel block 213, and the first pixel 610 includes a first sub-pixel 110, a first pixel block 212, and a third sub-pixel 310. The third sub-pixel 310 in the first minimum repeat unit, the second pixel block 213 and the first sub-pixel 110 in a second minimum repeat unit constitute a second pixel 620, and the first pixel 610 and the second pixel 620 share a third sub-pixel 310. The second minimum repeating unit in the present example includes a first pixel 610 and a second pixel block 213. The second pixel 620 described above shares the first sub-pixel 110 in the second pixel 620 with the first pixel 610 included in the second minimum repeating unit.

For example, as shown in FIGS. 2A-2D, in a case of high resolution, the second sub-pixel (green sub-pixel) plays a decisive role in the position of perceived luminance center position of each pixel, and therefore, the second sub-pixels located in all pixels should be uniformly distributed as a whole. For example, the uniform distribution of the second sub-pixels (green sub-pixels) as a whole can be realized through slight relative adjustments of positions of the sub-pixels across different rows and columns (the amplitude of the adjustments is about or less than half of the pitch of the sub-pixels). On this basis, the first sub-pixel and the third sub-pixel shared by two adjacent pixels should also be distributed as uniformly as possible in the two pixels together with the second sub-pixel.

For example, FIG. 2E and FIG. 2F are schematic diagrams of other minimum repeating units in the pixel arrangement structure shown in FIG. 2A, respectively. As shown in FIG. 2A and FIG. 2E, in each minimum repeating unit 500, the first sub-pixel 110 and the third sub-pixel 310 are adjacent to each other in the second direction; the first pixel block 212 is one block adjacent to the third sub-pixel 310 among the first and second pixel blocks in the second sub-pixel pair 210 adjacent to the third sub-pixel 310 along the second direction; the second pixel block 213 is one block remote from the first sub-pixel 110 among the first and second pixel blocks in the second sub-pixel pair 210 adjacent to both the first sub-pixel 110 and the third sub-pixel 310 along the extending direction of the diagonal line of the virtual rectangle 400. Here, the first pixel block 212 and the second sub-pixel block 213 are respectively located in two second sub-pixel pairs 210, and the shapes of the first pixel block 212 and the second pixel block 213 in the minimum repetition unit 500 may form a square.

For example, as shown in FIG. 2A and FIG. 2F, each minimum repeating unit 500 includes a first sub-pixel 110, a second sub-pixel pair 210, and a third sub-pixel 310. The first sub-pixel 110 and the third sub-pixel 310 are adjacent to each other along an extending direction (i.e., a B direction) of a first diagonal line of the virtual rectangle 400, the second sub-pixel pair 210 and the first sub-pixel 110 are adjacent to each other along an extending direction (i.e., an A direction) of a second diagonal line of the virtual rectangle, the second sub-pixel pair 210 and the third sub-pixel 310 are adjacent to each other along the second direction, and the extending direction of the first diagonal line and the extending direction of the second diagonal line are intersected with each other. Here, the first pixel block 212 and the second sub-pixel block 213 are located in the same second sub-pixel pair 210, and the shapes of the first pixel block 212 and the second pixel block 213 in the minimum repetition unit 500 may form a square.

FIGS. 2C-2F are exemplary of the division manners of the repeating units and virtual pixels and the sharing manners of the sub-pixels in the pixel arrangement structure provided by the embodiment of the present disclosure, and other division manners of the repeating units and virtual pixels or other sharing manners of the sub-pixels may be selected as needed. For example, a virtual pixel may contain only sub-pixels of two colors selected from the group consisting of red, green and blue, while borrowing a sub-pixel of the rest color in surrounding virtual pixels. In addition, the manner of pixel borrowing may not be adopted, that is, red, green and blue sub-pixels form real pixels for display.

Figure 3A:
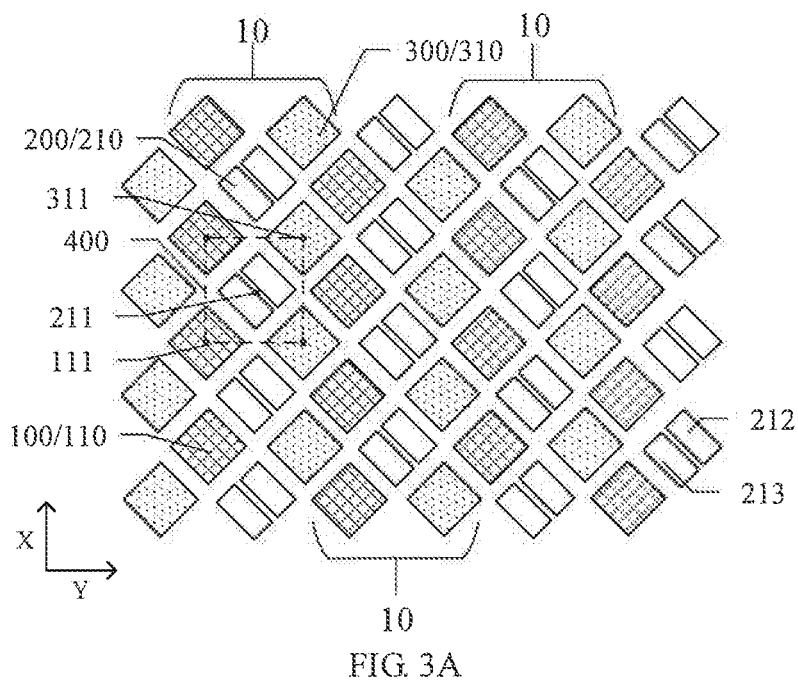
FIG. 3A is a schematic diagram of a pixel arrangement structure provided by another embodiment of the present disclosure.

For example, FIG. 3A is a schematic diagram of a pixel arrangement structure provided by another embodiment of the present disclosure. Different from the pixel arrangement structure shown in FIG. 2A, an angle between the extending direction of the long sides of the rectangular second sub-pixels 212 and 213 in the second sub-pixel pair 210 shown in FIG. 3A and the direction indicated by the arrow in the Y direction is an obtuse angle, for example, 135 degrees.

Figure 3B:
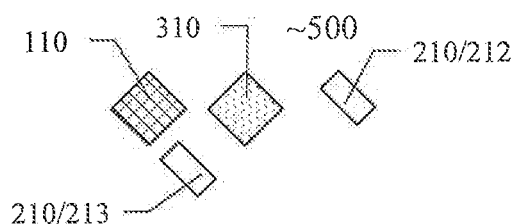
FIGS. 3B-3D are schematic diagrams of minimum repeating units with different arrangement manners in the pixel arrangement structure shown in FIG. 3A.
Figure 3C:
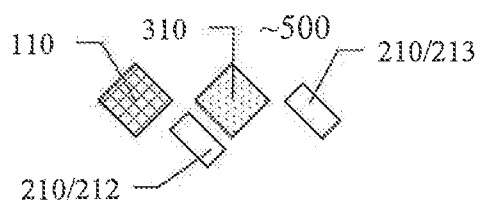
Figure 3D:
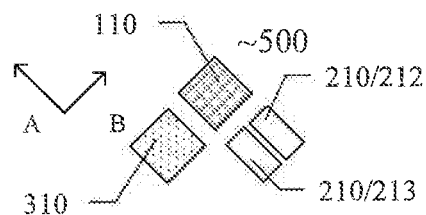

For example, FIGS. 3B-3D are schematic diagrams of minimum repeating units with different arrangement manners in the pixel arrangement structure shown in FIG. 3A.

For example, as shown in FIG. 3B, the first sub-pixel 110 is adjacent to the third sub-pixel 310 along the second direction, the first pixel block 212 is one block remote from the third sub-pixel 310 among the first and second pixel blocks in the second sub-pixel pair 210 adjacent to the third sub-pixel 310 along the second direction; and the second pixel block 213 is one block remote from the third sub-pixel 310 among the first and second pixel blocks in the second sub-pixel pair 210 adjacent to both the first sub-pixel 110 and the third sub-pixel 310 along an extending direction of a diagonal line of the virtual rectangle. Here, the first pixel block 212 and the second sub-pixel block 213 are respectively located in two second sub-pixel pairs 210.

For example, as shown in FIG. 3C, the first sub-pixel 110 is adjacent to the third sub-pixel 310 along the second direction; the first pixel block 212 is one block adjacent to the third sub-pixel 310 among the first and second pixel blocks in the second sub-pixel pair 210 adjacent to both the first sub-pixel 110 and the third sub-pixel 310 along an extending direction of a diagonal line of the virtual rectangle; and the second pixel block 213 is one block adjacent to the third sub-pixel 310 among the first and second pixel blocks in the second sub-pixel pair 210 adjacent to the third sub-pixel 310 along the second direction. Here, the first pixel block 212 and the second sub-pixel block 213 are respectively located in two second sub-pixel pairs 210.

For example, as shown in FIG. 3D, each minimum repeating unit 500 includes a first sub-pixel 110, a second sub-pixel pair 210 and a third sub-pixel 310, the first sub-pixel 110 and the third sub-pixel 310 are adjacent to each other along an extending direction (i.e., a B direction) of a first diagonal line of the virtual rectangle 400, the second sub-pixel pair 210 and the first sub-pixel 110 are adjacent to each other along an extending direction (i.e., an A direction) of a second diagonal of the virtual rectangle, the second sub-pixel pair 210 and the third sub-pixel 310 are adjacent to each other along the second direction, and the extending direction of the first diagonal line and the extending direction of the second diagonal line are intersected with each other. Here, the first pixel block 212 and the second sub-pixel block 213 are located in the same second sub-pixel pair 210.

In addition, the minimum repeating unit 500 shown in FIGS. 3B-3D has the same sub-pixel sharing characteristics as that in the above embodiments, and details will not be described here again.

Figure 3E:
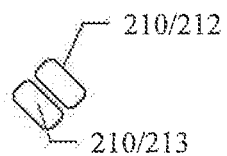
FIG. 3E is a schematic diagram of shape of a second sub-pixel pair shown in FIG. 3A.

For example, FIG. 3E is a schematic diagram of the shape of the second sub-pixel pair. As shown in FIG. 3E, the shapes of the two second sub-pixels 212 and 213 included in the second sub-pixel pair 210 may be rounded rectangles, and the two rounded rectangles may form a rounded square.

Figure 4A:
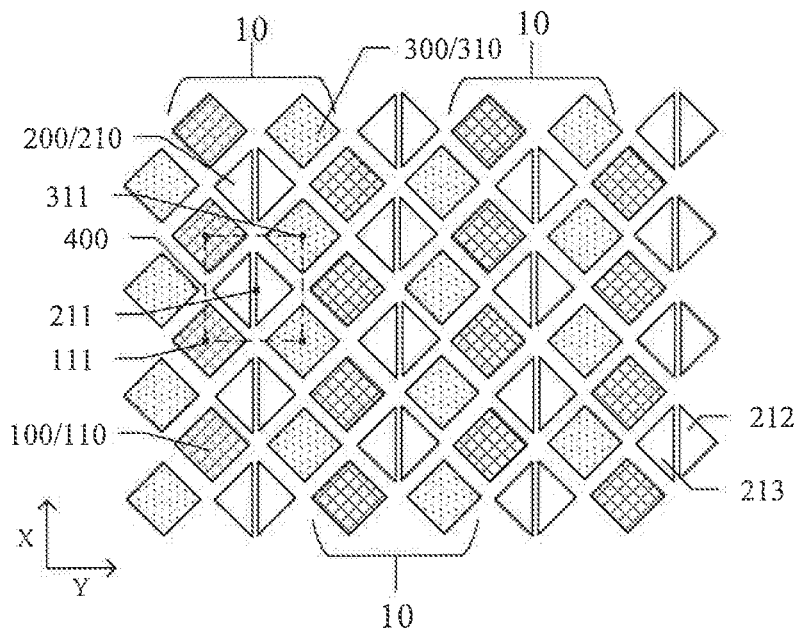
FIG. 4A is a schematic diagram of a pixel arrangement structure provided by further another embodiment of the present disclosure.

For example, FIG. 4A is a schematic diagram of a pixel arrangement structure provided by further another embodiment of the present disclosure. Different from the pixel arrangement structure shown in FIG. 2A, the shapes of the two second sub-pixels 212 and 213 in the second sub-pixel pair 210 in the present embodiment are both right triangles, and the hypotenuses of the right triangles are parallel to the first direction.

Figure 4B:
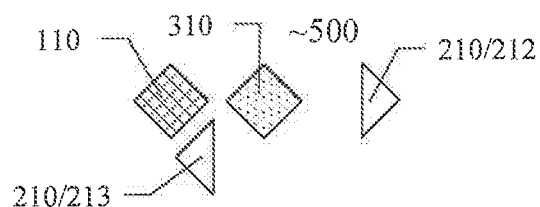
FIGS. 4B-4D are schematic diagrams of minimum repeating units with different arrangement manners in the pixel arrangement structure shown in FIG. 4A.
Figure 4C:
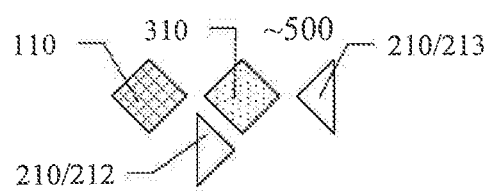
Figure 4D:
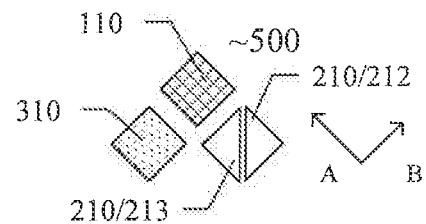

For example, FIGS. 4B-4D are schematic diagrams of minimum repeating units with different arrangement manners in the pixel arrangement structure shown in FIG. 4A. As shown in FIGS. 4A-4D, the shapes of the first pixel block 212 and the second pixel block 213 are both right triangles; one of the first pixel block 212 and the second pixel block 213 is located in the second sub-pixel pair 210 adjacent to both the first sub-pixel 110 and the third sub-pixel 310 along an extending direction of a diagonal line of the virtual rectangle; the other of the first pixel block 212 and the second pixel block 213 is located in the second sub-pixel pair 210 adjacent to the third sub-pixel 310 along the second direction; and along the first direction or the second direction, an orientation of a right angle of the first pixel block 212 is opposite to an orientation of a right angle of the second pixel block 213.

For example, as shown in FIG. 4B and FIG. 4C, the first pixel block 212 and the second sub-pixel block 213 are respectively located in two second sub-pixel pairs 210.

For example, as shown in FIG. 4D, the first pixel block 212 and the second pixel block 213 are located in the same second sub-pixel pair 210.

For example, a direction indicated by the arrow in the X direction in FIG. 4A is upward, a direction indicated by the arrow in the Y direction is right, the orientation of the right angle of the first pixel block 212 shown in FIGS. 4B-4D is toward the right, and the orientation of the right angle of the second pixel block 213 shown in FIGS. 4B-4D is toward the left.

In addition, the minimum repeating unit 500 shown in FIGS. 4B-4D has the same sub-pixel sharing characteristics as that in the above embodiments, and details will not be described here again.

Figure 4E:
FIG. 4E is a schematic diagram of shape of a second sub-pixel pair shown in FIG. 4A.

For example, FIG. 4E is a schematic diagram of the shape of the second sub-pixel pair. As shown in FIG. 4E, the shapes of the two second sub-pixels 212 and 213 included in the second sub-pixel pair 210 can be rounded right triangles, and the two rounded right triangles can form a rounded square.

For example, a direction indicated by the arrow in the X direction is upward, a direction indicated by the arrow in the Y direction is right, an orientation of a rounded right angle of the first pixel block 212 shown in FIG. 4E is toward the right, and an orientation of a rounded right angle of the second pixel block 213 is toward the left.

Figure 5A:
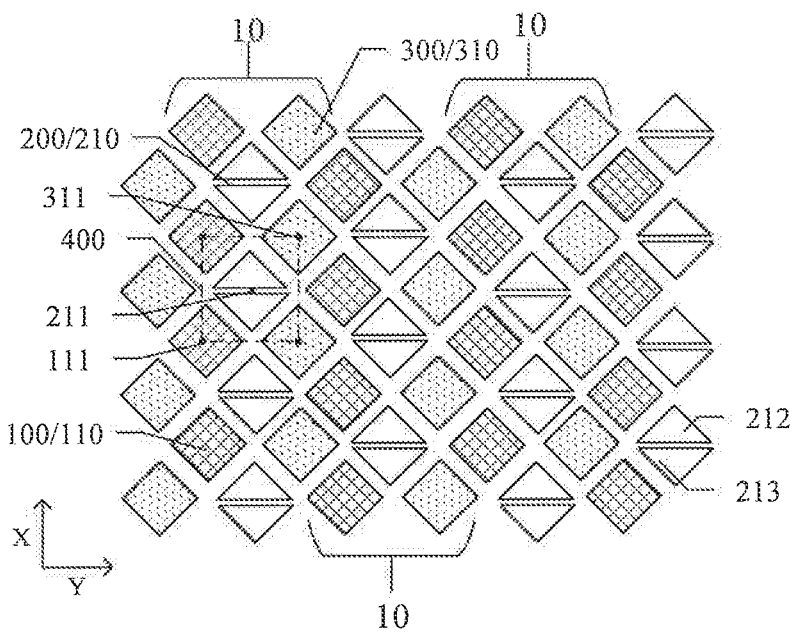
FIG. 5A is a schematic diagram of a pixel arrangement structure provided by still another embodiment of the present disclosure.

For example, FIG. 5A is a schematic diagram of a pixel arrangement structure provided by still another embodiment of the present disclosure. Different from the pixel arrangement structure shown in FIG. 4A, the hypotenuses of the two second sub-pixels 212 and 213 having a shape of right triangle in the second sub-pixel pair 210 in the present embodiment are parallel to the second direction.

Figure 5B:
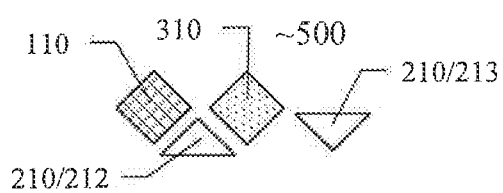
FIGS. 5B-5D are schematic diagrams of minimum repeating units with different arrangement manners in the pixel arrangement structure shown in FIG. 5A.
Figure 5C:
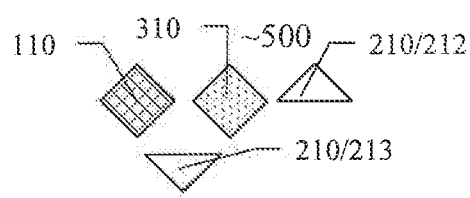
Figure 5D:
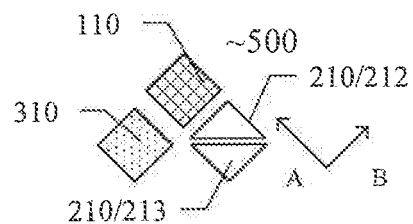

For example, FIGS. 5B-5D are schematic diagrams of minimum repeating units with different arrangement manners in the pixel arrangement structure shown in FIG. 5A. As shown in FIGS. 5A-5D, the shapes of the first pixel block 212 and the second pixel block 213 are both right triangles; one of the first pixel block 212 and the second pixel block 213 is located in the second sub-pixel pair 210 adjacent to both the first sub-pixel 110 and the third sub-pixel 310 along an extending direction of a diagonal line of the virtual rectangle; the other of the first pixel block 212 and the second pixel block 213 is located in the second sub-pixel pair 210 adjacent to the third sub-pixel 310 along the second direction; and along the first direction or the second direction, an orientation of a right angle of the first pixel block 212 is opposite to an orientation of a right angle of the second pixel block 213.

For example, as shown in FIG. 5B and FIG. 5C, the first pixel block 212 and the second sub-pixel block 213 are respectively located in two second sub-pixel pairs 210.

For example, as shown in FIG. 5D, the first pixel block 212 and the second sub-pixel block 213 are located in the same second sub-pixel pair 210.

For example, a direction indicated by the arrow in the X direction in FIG. 5A is upward, a direction indicated by the arrow in the Y direction is right, the orientation of the right angle of the first pixel block 212 shown in FIGS. 5B-5D is upward, and the orientation of the right angle of the second pixel block 213 is downward.

In addition, the minimum repeating unit 500 shown in FIGS. 5B-5D has the same sub-pixel arrangement characteristics and sub-pixel sharing characteristics as those in the above embodiments, and details will not be described here again.

Figure 6:
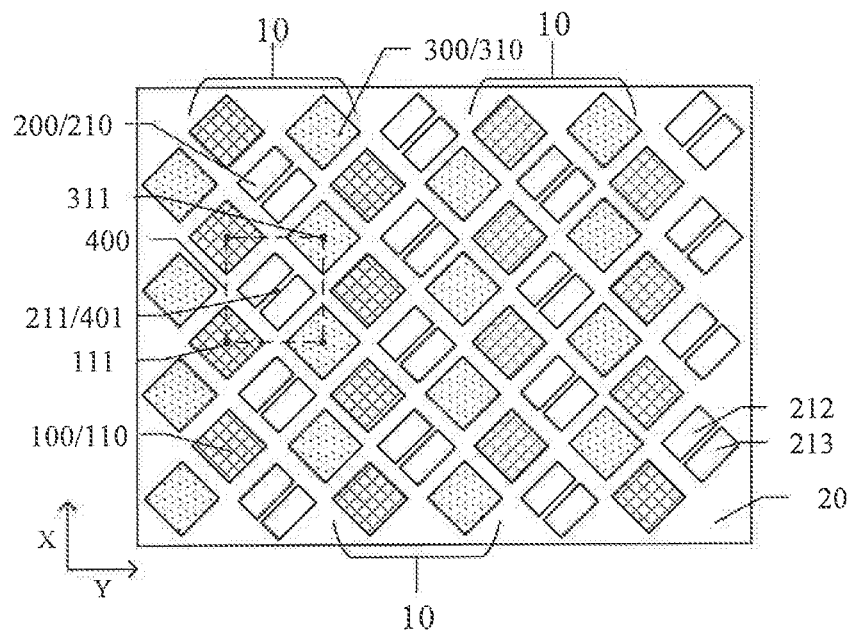
FIG. 6 is a schematic diagram of a display substrate provided by an embodiment of the present disclosure.

FIG. 6 is a schematic diagram of a display substrate provided by an embodiment of the present disclosure. As shown in FIG. 6, the display substrate includes a base substrate 20 and the pixel arrangement structure according to any one of the above embodiments located on the base substrate 20. In FIG. 6, the pixel arrangement structure is the pixel arrangement structure 1000 shown in FIG. 2A.

For example, the display substrate can be an array substrate of an organic light emitting diode display device, the first sub-pixel 110 includes a first pixel electrode and a first light emitting layer disposed on the first pixel electrode, each of the second sub-pixels 212 and 213 in the second sub-pixel pair 210 includes a second pixel electrode and a second light emitting layer disposed on the second pixel electrode, and the third sub-pixel 310 includes a third pixel electrode and a third light emitting layer disposed on the third pixel electrode. The first pixel electrode has the same shape as the first sub-pixel 110 and is configured to drive the first light emitting layer to emit light, the second pixel electrode has the same shape as the second sub-pixels 212 and 213 and is configured to drive the second light emitting layer to emit light, and the third pixel electrode has the same shape as the third sub-pixel 310 and is configured to drive the third light emitting layer to emit light.

For example, the display substrate can be a color filter substrate of a liquid crystal display device, the first sub-pixel 110 includes a first filter, each of the second sub-pixels 212 and 213 includes a second filter, and the third sub-pixel 310 includes a third filter.

Figure 7:
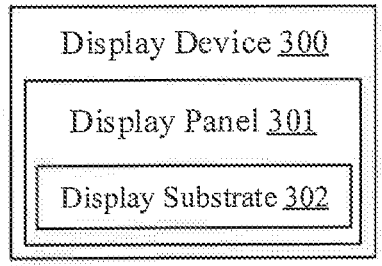
FIG. 7 is a schematic diagram of a display device provided by an embodiment of the present disclosure.

FIG. 7 is a schematic block diagram of a display device provided by an embodiment of the disclosure. The display device 300 includes a display panel 301 including a display substrate 302 according to any one of the above embodiments.

For example, the display panel 301 can be a liquid crystal display panel or an organic light emitting diode (OLED) display panel or the like. When the display panel 301 is a liquid crystal display panel, the display substrate 302 can be an array substrate or a color filter substrate. When the display panel 301 is an organic light emitting diode display panel, the display substrate 302 can be an array substrate.

For example, the display device can be a display device, such as a liquid crystal display device, an organic light-emitting diode (OLED) display device, and any product or component including the display device and having a display function, such as a television, a digital camera, a mobile phone, a watch, a tablet computer, a notebook computer, a navigator and the like, and the present embodiment is not limited thereto.

The following statements should be noted:

(1) Unless otherwise defined, in the embodiments of the present disclosure and the accompanying drawings, the same reference numerals represent the same meanings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. It should be understood that, in the case in which a component or element such as a layer, film, area, substrate or the like is referred to be "on" or "under" another component or element, it may be directly on or under the another component or element or a component or element is interposed therebetween.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A pixel arrangement structure, comprising:
a plurality of pixel groups extending in a first direction and arranged in a second direction, each of the plurality of pixel groups comprising one first sub-pixel row, one second sub-pixel row and one third sub-pixel row extending in the first direction and sequentially arranged in the second direction, the first sub-pixel row comprising a plurality of first sub-pixels, the second sub-pixel row comprising a plurality of second sub-pixel pairs, the third sub-pixel row comprising a plurality of third sub-pixels, a pitch of the plurality of first sub-pixels, a pitch the plurality of second sub-pixel pairs and a pitch the plurality of third sub-pixels in the first direction are identical to one another;
wherein, in each of the plurality of pixel groups, a line through centers of a first sub-pixel and a third sub-pixel adjacent to each other are substantially parallel to the second direction, the first sub-pixel row is shifted from the second sub-pixel row by half of the pitch along the first direction, orthographic projections of a second sub-pixel pair and a first sub-pixel adjacent to each other, on a straight line extending in the first direction, overlap with each other, and the first sub-pixel rows of two adjacent pixel groups are shifted from each other by half of the pitch along the first direction,
wherein the first sub-pixels, the second sub-pixel pairs and the third sub-pixels are all of a square or rounded square shape, diagonal lines of the square or rounded square shape are substantially parallel to the first direction or the second direction, and the first direction is substantially perpendicular to the second direction, and
wherein in the first direction, a minimum distance between two adjacent second sub-pixel pairs is less than at least one of a size of each of the first sub-pixels and a size of each of the third sub-pixels.

2. The pixel arrangement structure according to claim 1, wherein the second sub-pixel pairs are green sub-pixel pairs, the first sub-pixels are red sub-pixels and the third sub-pixels are blue sub-pixels; or, the first sub-pixels are blue sub-pixels and the third sub-pixels are red sub-pixels.

3. The pixel arrangement structure according to claim 1, wherein the first sub-pixels, the second sub-pixel pairs and the third sub-pixels have a substantial identical side length.

4. The pixel arrangement structure according to claim 1, wherein two second sub-pixels in each of the second sub-pixel pairs are of substantial identical shape and size.

5. The pixel arrangement structure according to claim 4, wherein a minimum distance between the two second sub-pixels in each of the second sub-pixel pairs is less than a minimum distance between the second sub-pixel pairs and the first sub-pixels or between the second sub-pixel pairs and the third sub-pixels.

6. The pixel arrangement structure according to claim 4, wherein the two second sub-pixels in each of the second sub-pixel pairs have a shape of rectangle or rounded rectangle.

7. The pixel arrangement structure according to claim 4, wherein the two second sub-pixels in each of the second sub-pixel pairs have a shape of right triangle or rounded right triangle.

8. The pixel arrangement structure according to claim 4, wherein, in each of the plurality of pixel groups, centers of two adjacent first sub-pixels and centers of two third sub-pixels respectively adjacent to the two adjacent first sub-pixels in the second direction are four vertices of a virtual rectangle, a center of one second sub-pixel pair surrounded by the four sub-pixels is located at a center of the virtual rectangle, and a distance along the first direction between centers of two adjacent virtual rectangles in two adjacent pixel groups respectively, is half of a side length of the virtual rectangle.

9. The pixel arrangement structure according to claim 8, wherein two second sub-pixels in each of the second sub-pixel pairs are a first pixel block and a second pixel block, respectively, the pixel arrangement structure comprises a plurality of minimum repeating units, each of the plurality of minimum repeating units comprises one first sub-pixel, one first pixel block, one second pixel block and one third sub-pixel, one of the first pixel block and the second pixel block forms a first virtual pixel together with the first sub-pixel, and the other of the first pixel block and the second pixel block forms a second virtual pixel together with the third sub-pixel.

10. The pixel arrangement structure according to claim 9, wherein each of the plurality of minimum repeating units comprises one first sub-pixel, one second sub-pixel pair, and one third sub-pixel, and in each of the plurality of minimum repeating units, the first sub-pixel and the third sub-pixel are adjacent to each other along an extending direction of a first diagonal line of the virtual rectangle; the second sub-pixel pair and the first sub-pixel are adjacent to each other along an extending direction of a second diagonal line of the virtual rectangle; the second sub-pixel pair and the third sub-pixel are adjacent to each other along the second direction, and the extending direction of the first diagonal line and the extending direction of the second diagonal line are intersected with each other.

11. The pixel arrangement structure according to claim 9, wherein the first sub-pixel and the third sub-pixel in each of the plurality of minimum repeating units are adjacent to each other along the second direction.

12. The pixel arrangement structure according to claim 11, wherein in each of the plurality of minimum repeating units, the first pixel block is one pixel block adjacent to the third sub-pixel among the first and second pixel blocks in the second sub-pixel pair adjacent to the third sub-pixel along the second direction, and the second pixel block is one pixel block remote from the first sub-pixel among the first and second pixel blocks in the second sub-pixel pair adjacent to both the first sub-pixel and the third sub-pixel along an extending direction of a diagonal line of the virtual rectangle.

13. The pixel arrangement structure according to claim 11, wherein in each of the plurality of minimum repeating units, the first pixel block is one pixel block adjacent to the first sub-pixel among the first and second pixel blocks in the second sub-pixel pair adjacent to both the first sub-pixel and the third sub-pixel along an extending direction of a diagonal line of the virtual rectangle, and the second pixel block is one pixel block remote from the third sub-pixel among the first and second pixel blocks in the second sub-pixel pair adjacent to the third sub-pixel along the second direction.

14. The pixel arrangement structure according to claim 11, wherein in each of the plurality of minimum repeating units, the first pixel block is one pixel block remote from the third sub-pixel among the first and second pixel blocks in the second sub-pixel pair adjacent to the third sub-pixel along the second direction, and the second pixel block is one pixel block remote from the third sub-pixel among the first and second pixel blocks in the second sub-pixel pair adjacent to both the first sub-pixel and the third sub-pixel along an extending direction of a diagonal line of the virtual rectangle.

15. The pixel arrangement structure according to claim 11, wherein in each of the plurality of minimum repeating units, the first pixel block is one pixel block adjacent to the third sub-pixel among the first and second pixel blocks in the second sub-pixel pair adjacent to both the first sub-pixel and the third sub-pixel along an extending direction of a diagonal line of the virtual rectangle, and the second pixel block is one pixel block adjacent to the third sub-pixel among the first and second pixel blocks in the second sub-pixel pair adjacent to the third sub-pixel along the second direction.

16. The pixel arrangement structure according to claim 11, wherein in each of the plurality of minimum repeating units, shapes of the first pixel block and the second pixel block are right triangles or rounded right triangles; one of the first pixel block and the second pixel block is located in the second sub-pixel pair adjacent to both the first sub-pixel and the third sub-pixel along an extending direction of a diagonal line of the virtual rectangle; the other of the first pixel block and the second pixel block is located in the second sub-pixel pair adjacent to the third sub-pixel along the second direction; and along the first direction or the second direction, an orientation of a right angle or rounded right angle of the first pixel block is opposite to an orientation of a right angle or rounded right angle of the second pixel block.

17. The pixel arrangement structure according to claim 1, wherein along the first direction, a minimum distance between two adjacent first sub-pixels is substantially equal to a minimum distance between two adjacent third sub-pixels.

18. A display device, comprising a display substrate including the pixel arrangement structure according to claim 1.

* * * * *